United States Patent Office 2,861,058

Patented Nov. 18, 1958

2,861,058

LIGHT-SENSITIVE POLYMERS FOR MAKING PRINTING PLATES

Cornelius C. Unruh, Gerhard W. Leubner, and Albert C. Smith, Jr., Rochester, N. Y., assignors to Eastman Kodak Company, Rochester, N. Y., a corporation of New Jersey No Drawing. Application July 29, 1955
Serial No. 525,367

3 Claims. (Cl. 260—78.5)

This invention relates to light-sensitive polymers of particular use in the preparation of resist images for printing plates.

Various polymeric materials have previously been proposed for use in the preparation of resist images for printing plates. Some of the first efforts involved the use of coatings of polymers not inherently light-sensitive but to which were added sensitizing agents such as bichromates to render the polymers capable of being insolubilized imagewise upon exposure to light. More recently, polymers have been described which possess inherent light-sensitivity and without addition of a light-sensitizing agent coatings of the polymers on a plate or other support can therefore be exposed imagewise to insolubilize the polymer after which the unexposed area of the polymer coating can be removed with organic solvent to leave a resist image on the support. The cinnamic acid esters of polyvinyl alcohol described by Minsk et al., U. S. Patent 2,690,966, granted October 5, 1954, are illustrative of such inherently light-sensitive polymers whose light-sensitivity appears to be attributable to the presence in the polymer molecule of a substantial number of reactive cinnamoyl groups. Because these cinnamic acid esters of polyvinyl alcohol are soluble only in organic solvents, it will be apparent that for the purpose of making printing plates and similar usages, after imagewise insolubilization of coatings of the polymers organic solvents must be used to dissolve away the unexposed polymer to obtain a resist image. The need for polymers possessing the important light-sensitive features of the cinnamic acid esters of polyvinyl alcohol but also capable of being handled with less costly and less hazardous solvents such as water or aqueous acid or alkaline solutions is therefore apparent.

We have discovered certain inherently light-sensitive polymers which contain solubilizing groups which groups render the polymers capable of being coated from and processed with aqueous alkaline solutions substantially free of organic solvents. The alkali susceptibility of the polymers is due to the presence in the polymer molecule of a substantial number of carboxyl groups as opposed to sulfonic acid groups.

One object of our invention is to provide inherently light-sensitive polymers which can be handled with alkaline solutions. Other objects of our invention involve providing sensitive photographic elements comprising the light-sensitive alkali-susceptible polymers. Further objects of our invention include providing methods for utilizing the alkali-susceptible polymers in the preparation of printing plates.

The inherently light-sensitive alkali-susceptible polymers of the invention include vinyl cinnamate copolymers containing from about 10 to 70 mole percent of recurring units having the general structure (I) —$CH_2$—CH(—)—O—CO—CH=CH—R wherein R represents a univalent aromatic nucleus of the benzene series whose free valence belongs to the aromatic nucleus such as phenyl, o-tolyl, o-chlorophenyl and m-nitrophenyl, and from about 30 to 70 mole percent of recurring units having the general formula (II) —$CH_2$—CH(—)—O—CO—R′—COOH wherein R represents either an alkylene group preferably of from 1 to 3 carbon atoms such as present in the dibasic aliphatic acid hydrocarbon residues —$CH_2$—, —$C_2H_4$—, —$C_3H_6$— and —CH=CH— of malonic, succinic, glutaric and maleic acids respectively, or R′ represents a bivalent aromatic nucleus whose free valences belong to the aromatic nucleus such as present in the dibasic aromatic acid hydrocarbon residues such as phenyl, nitrophenyl and cyclohexenyl as present in phthalic, isophthalic, terephthalic, 3-nitrophthalic and tetrahydrophthalic acids.

The remaining recurring structural units of the light-sensitive alkali-susceptible polymers (0–30 mole percent) are not especially critical and include any polymeric units, other than those mentioned above, which are derived from polymerization of vinyl esters with other polymerizable materials such as ethylene, vinyl chloride, vinyl ketones, vinyl ethers, allyl esters and acrylic acid esters. Therefore, the polymers contain at least 70 mole percent of recurring units having structures I and II above.

The compositions of the polymers can be further understood by considering that the following units may be present in the polymer chains

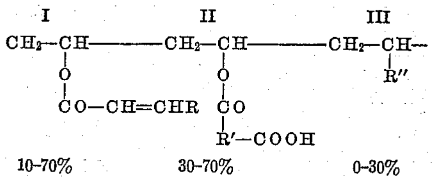

wherein R″ of unit III may, for example, be an alkoxyl group such as methoxyl, acetyl, halogen, hydrogen, or a carbomethoxy group. In order to incorporate the essential properties in the polymer units I and II together must comprise at least about 70 mole percent of the polymeric units and in order to assure adequate light-sensitivity in the polymer at least about 10 and no more than about 70 mole percent of the units have structure I and to assure adequate alkali solubility at least about 30 and no more than about 70 mole percent of the units have structure II.

Polymers containing units I, II and III are illustrated by an ethylene vinyl acetate copolymer which has been hydrolyzed to yield an ethylene-vinyl alcohol copolymer and which has then been partially esterified with cinnamic acid chloride to the extent of 10–70 mol percent followed by esterifying the residual vinyl alcohol units with a dibasic acid anhydride such as succinic anhydride to the extent of 30 to 70 mol percent. This polymer contains ethylene, vinyl cinnamate and vinyl hydrogen succinate units.

A particularly valuable group of light-sensitive alkali-susceptible polymers of the invention contain only polymeric units I and II above in the proportion of from about 30 to 60 mole percent of the light-sensitive units I and from about 70 to 40 mole percent of the alkali solubilizing units II, illustrated by a vinyl cinnamate-vinyl hydrogen phthalate copolymer prepared by esterifying polyvinyl alcohol partly with a cinnamic acid halide and partly with phthalic acid anhydride. These polymers may, therefore, contain 30–60% of units I and 70–40% of the following representative units of structure II.

(A)

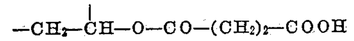

(B)

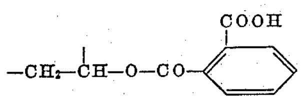

(C)

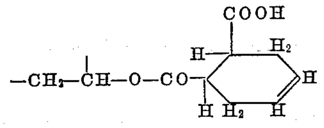

(D)

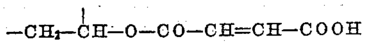

(E)

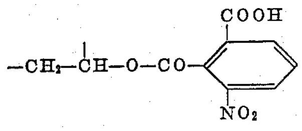

As mentioned, units A–E are incorporated into the polymer molecule by esterifying polyvinyl alcohol with the corresponding dibasic acid either before or after esterification with the cinnamic acid halide.

The following examples illustrate the preparation of the polymers mentioned.

EXAMPLE 1

*Polyvinyl cinnamate succinates and phthalates*

A series of partially cinnamoylated polyvinyl alcohols were prepared by heating 1-mole samples of polyvinyl alcohol in 416 cc. of pyridine on a steam bath overnight, and after addition of 356 cc. of pyridine, the quantities of cinnamoyl chloride indicated in the following table were added slowly to the respective reaction mixtures. Heating was carried out for 4 hours at 50° C., after which the samples were diluted with acetone, precipitated in cold water, washed and dried. The cinnamoyl content of the resultant polymers is also shown in the following table. The residual hydroxyl in each partially cinnamoylated polymer sample was then esterified by suspending or dissolving 10 grams of each sample in dry pyridine and adding succinic or phthalic anhydride in pyridine to each sample in 100 percent excess of the calculated amount necessary to completely esterify the residual hydroxyl in each sample. The mixtures were then heated at 50° C. for several days, diluted with acetone and precipitated into excess dilute acetic acid.

TABLE I

| Sample | Mole percent Cinnamoyl Chloride Used | Mole percent Cinnamoylation |
|---|---|---|
| G113-191 | 45 | 27.5 |
| G113-190 | 50 | 32.5 |
| G138-31 | 55 | 36.5 |
| G113-188 | 55 | 28.5 |
| G113-187 | 60 | 43.0 |
| G113-186 | 65 | 49.0 |
| G113-185 | 70 | 54.0 |
| G113-180 | 75 | 59.5 |

Two series of polymers, that is, polyvinyl cinnamate succinates and polyvinyl cinnamate phthalates containing units of structures A and B above were thus obtained, each series including polymers containing from 27.5 to 59.5 mole percent of cinnamoyl groups and from 72.5 to 40.5 mole percent of hydrogen succinoyl or hydrogen phthaloyl. In the cinnamate succinate series, the polymers containing from 27.5 to 38.5 cinnamoyl were readily soluble in 2 percent ammonia solution and the 43.0 to 59.5 mole percent cinnamoylated samples dissolved upon addition of a small amount of alcohol to the ammoniacal solution. In the cinnamate-phthalate series, the 27.5 to 49 mole percent cinnamate polymers dissolved readily in a 2 percent ammonia solution and the other polymers upon addition of alcohol.

In a similar manner, in order to provide other useful light-sensitive polyvinyl cinnamate copolymers, polyvinyl alcohol can be esterified to the extent of about 30 to 70 mole percent with other cinnamic acid halides such as o-chlorocinnamic acid chloride, m-nitrocinnamic acid chloride, α-phenylcinnamic acid chloride and β-phenylcinnamic acid chloride and the residual vinyl alcohol units of the polymer may be esterified with the acid anhydrides of the above-mentioned dibasic acids given for illustration.

The light-sensitivity of the polyvinyl cinnamate phthalate and polyvinyl cinnamate succinate polymers was ascertained by a procedure which simulates the actual use of the polymers in making printing plates. The polymers were dissolved in 0.5 percent aqueous ammonium hydroxide solution to obtain a weight-volume concentration of 1.5 percent. Thereafter the polymer solutions were coated onto grained aluminum surfaces. The coatings were then exposed to an ultraviolet light source under a graduated density step tablet to insolubilize the polymer coatings in the region of exposure. Thereafter, the unexposed polymer of the coatings was removed from each plate by treatment with a dilute ammonium hydroxide solution of pH 10.5. The residual insolubilized polymer remaining on the plate in the form of a step tablet in relief was then dyed to render it visible. The fact that all of the plates thus exposed and processed contained a visible image of some of the steps of the original step tablet indicated that all of the polymers were light-sensitive. However, it was found from examination of the images on the plates that the series of polyvinyl cinnamate phthalate polymers were less sensitive than the polyvinyl cinnamate succinate polymers of comparable composition. When light-sensitivity is referred to hereinafter, it will therefore be understood that it means sensitivity as measured under the above conditions.

It was ascertained that the sensitivity of the polymers of Example 1 could be greatly increased by the addition to coatings of the polymers, of various sensitizing agents which are known to sensitize polyvinyl cinnamate, for example, the nitro, triphenylmethane, anthrone, quinone and ketone sensitizing agents of the Minsk et al U. S. Patents 2,610,120, 2,690,966, 2,670,285, 2,670,286 and 2,670,287 respectively, and the thiazole sensitizing agents of the Robertson et al. U. S. patent application Serial No. 314,806, filed October 15, 1952. Specific compounds illustrative of the useful sensitizing agents are:

2-benzoylmethylene-1-methyl-β-naphthothiazoline
2-(o-hydroxybenzoylmethylene) - 1 - methyl-β-naphthothiazoline
Bz-1-bz-2-benzanthronedicarboxylic anhydride
Picric acid
2,4,6-trinitrobenzoic acid
3,3′-diethyl-4,5,4′,5′,-dibenzothiacyanine chloride
3,3′-diethyl thiacarbocyanine iodide
1,2-benzanthraquinone
Picramide
Michler's ketone In view of the limited solubility of some of the above sensitizing agents in dilute alkaline solutions from which coatings of the alkali-soluble polymers may be made, the sensitizers may be added to such alkaline coating solutions in solid form or from solvent solutions such as ethyl alcohol. A preferred method of preparing the light-sensitive coatings of the alkali-susceptible polymers is to dissolve the given polymer in an organic solvent which is a common solvent for both the polymer and the sensitizing agent. Coatings made from such solutions exhibit maximum light-sensitivity when processed as described using aqueous alkaline solutions such as dilute aqueous ammonium hydroxide solution.

EXAMPLE 2

*Vinyl m-nitrocinnamate-vinyl succinate and phthalate copolymers and vinyl p-methoxycinnamate-vinyl succinate and phthalate copolymers*

A partial m-nitrocinnamic acid ester of polyvinyl alcohol was prepared as follows:

A suspension of 22 g. (0.5 mole) of polyvinyl alcohol in 220 ml. of anhydrous pyridine was swelled by heating on a steam bath for one hour. After cooling to room temperature, 52.8 g. (0.25 mole) of m-nitrocinnamoyl chloride was then added portionwise in 10 minutes. The temperature rose to 54° and the mixture became a gel-like mass. An additional 100 ml. of pyridine was added, and the mixture was heated in a 50° bath for 4 hours. The viscous dope was then diluted with pyridine and acetone and precipitated into water. The product was washed five times with water and dried in a 50° oven. Yield, 55 g. The polyvinyl m-nitrocinnamate obtained contained 35–40 mole percent of vinyl m-nitrocinnamate.

A partial p-methoxycinnamic acid ester of polyvinyl alcohol was prepared as follows:

A suspension of 35.2 g. (0.8 mole) of polyvinyl alcohol in 350 ml. of anhydrous pyridine was swelled by heating on a steam bath for one hour. After cooling to room temperature, 78.6 g. (0.4 mole) of p-methoxycinnamoyl chloride was added portionwise in 12 minutes. The temperature rose to 59°. After heating in a 50° bath for 5 hours, the reaction mixture was diluted with 50 ml. of pyridine and 350 ml. of acetone and precipitated into cold tap water. The fibrous product was washed five times with room temperature tap water and dried in a 50° oven to give 85 g. of polymer. The polyvinyl p-methoxycinnamate obtained contained 40 mole percent vinyl p-methoxycinnamate.

Ten grams of each of the above vinyl m-nitrocinnamate and vinyl-p-methoxycinnamate polymers were added to 40 cc. portions of anhydrous pyridine. To these mixtures were added warm solutions of succinic or phthalic anhydride, in 100% excess of the calculated amount necessary to completely esterify the residual hydroxy groups, dissolved in 50 cc. anhydrous pyridine. The amount of anhydride used is shown in Table II. The mixtures were then heated at 50° C. for four days.

In the case of the nitro-substituted polymers, a highly swollen mass formed. After dilution with pyridine and acetone, the mixture was precipitated into dilute acetic acid, washed several times with distilled water and dried in a 50° oven.

Solution occurred during the succinylation and phthaloylation of the methoxycinnamate polymers and the resulting dopes were precipitated into dilute acetic acid.

TABLE II

| Polymer | Succinic Anhydride, g. | Phthalic Anhydride, g. |
|---|---|---|
| Vinyl m-nitrocinnamate G492–105 | 7.6 | |
| Vinyl m-nitrocinnamate G492–106 | | 11.2 |
| Vinyl p-methoxycinnamate G492–107 | 8.05 | |
| Vinyl p-methoxycinnamate G492–108 | | 11.9 |

The polymers Nos. G492–105, G492–106, G492–107 and G492–108 were tested for light-sensitivity by the method described above using a concentration of 0.75 percent polymer in 0.5 percent aqueous ammonium hydroxide solution, coating the solutions upon aluminum plates, exposing under a step tablet and processing in a tray for one minute with 0.5 percent ammonia solution followed by dyeing the resulting resist images with an alcoholic solution of methyl violet dye. The polymers were also tested for light-sensitivity in the same manner except by incorporating 10 percent of the weight of polymer of either Sensitizer No. 1 (4,4′-diazidostilbene-2,2′-disulfonic acid) or Sensitizer No. 2 (2-benzoylmethylene-1-methyl-β-naphthothiazoline) into the ammoniacal solutions of the polymers. The speed values calculated from the step tablet images on the aluminum plates is tabulated in Table III hereinafter.

TABLE III

| Sample Number | Polymer | Speed | | |
|---|---|---|---|---|
| | | Unsens. | Sens. #1 | Sens. #2 |
| G492–105 | PV m-nitrocinnamate succinate. | 4 | 44 | 16 |
| G492–106 | PV m-nitrocinnamate phthalate. | 5.6 | 32 | 11 |
| G492–107 | PV p-methoxycinnamate succinate. | 64 | 1,400 | 500 |
| G492–108 | PV p-methoxycinnamate phthalate. | 8 | 22 | 32 |
| G492–132 | PV cinnamate maleate | 0.7 | 700 | 130 |
| G492–102 | PV cinnamate 3-nitrophthalate. | 8 | | |
| G492–101 | PV cinnamate tetrahydrophthalate. | v. low | 360 | 32 |

EXAMPLE 3

*Vinyl cinnamate-vinyl maleate copolymer (G492–132)*

Ten grams of ground polyvinyl cinnamate with 35.5 mole percent cinnamoylation prepared by the method of Example 1, 35.2 g. of sodium acetate and 100 ml. of acetic acid were heated on a steam bath with stirring for one-half hour. A solution of 35.1 g. maleic anhydride in 50 ml. acetic acid was then added dropwise with stirring and continued heating over one hour. During this time the reaction mixture became quite dark. After allowing the reaction to run 15 minutes longer, it was filtered and precipitated into distilled water. The polymer was washed several times with distilled water and dried at room temperature. The resulting polymer contained about 35.5 mole percent of vinyl cinnamate and the balance being vinyl hydrogen maleate units having the structural unit D shown above. The speed of the polymer (G492–132) with and without Sensitizer 1 and Sensitizer 2 obtained by the method of Example 2 is shown in Table III.

EXAMPLE 4

*Vinyl cinnamate-vinyl 3-nitrophthalate copolymer (G492–102)*

Ten grams of the above polyvinyl cinnamate with 35.5 mole percent cinnamoylation was dissolved in 40 ml. dry pyridine. To this was added a solution of 27.6 g. of 3-nitrophthalic anhydride in 90 ml. of dry pyridine. After heating at 50° for 48 hours, the mixture was precipitated into approximately 3 l. of distilled water containing 190 ml. of acetic acid. The polymer was washed several times with distilled water and then dried at 50° C. The resulting polymer contained about 35.5 mole percent of vinyl cinnamate units and the balance of the polymeric units were vinyl 3-nitro hydrogenphthalate units of the structure E shown above. The speed of the polymer unsensitized obtained by the method of Example 2 is shown in Table III.

EXAMPLE 5

*Vinyl cinnamate-vinyl Δ⁴-tetrahydrophthalate copolymer (G492–101)*

This polymer was prepared by the method of Example 4 except substituting 21.8 grams of $\Delta^4$-tetrahydrophthalic acid anhydride for the 3-nitrophthalic acid anhydride. The resulting polymer contained 35.5 mole percent of vinyl cinnamate and the balance of the recurring units of the polymer were substantially all vinyl hydrogentetrahydrophthalate units of structure C shown above. The speed of the polymer obtained by the method of Example 2 sensitized with sensitizers 1 and 2 is shown in Table III.

EXAMPLE 6

*Ethylene-vinyl cinnamate-vinyl hydrogensuccinate terpolymer*

Cinnamoyl chloride in the amounts shown in the following table was added dropwise with stirring to suspensions of 5 grams ethylene-vinyl alcohol copolymers containing 7 and 33 mole percent ethylene in 50 ml. of dry pyridine. Each mixture was then heated in a 50° C. bath with stirring for 4 hours, diluted with acetone and water and precipitated into distilled water. The polymer was washed several times with water and dried at approximately 50°. In the case of G527–85 it was necessary to heat the reaction mixture on a steam bath for one hour to bring about solution.

These partially cinnamoylated ethylene-vinyl alcohol copolymers were then allowed to swell in 50 ml. of pyridine and completely succinylated with a 100% excess of succinic anhydride in 50 ml. of pyridine by heating at 50° for approximately 3 days. The resulting polymers were isolated by diluting the reaction solutions with acetone and precipitating into 3 l. distilled water containing 140 ml. of glacial acetic acid. The polymers were washed several times with distilled water and dried in a 50° oven.

All samples were soluble in dilute alkaline solutions and the sensitivity tests were made by coating from and developing in 0.5% ammonium hydroxide solution using 1-methyl-2-(3-sulfobenzoylmethylene) - $\beta$ - naphthothiazoline pyridine salt as the light sensitizing agent. Sample G527–83 illustrates the premise mentioned that the polymers should contain no less than about 10 mol percent of vinyl cinnamate units in order to possess useful light-sensitivity

| Polymer | Cinnamoyl Chloride Used, g. | Mole Percent Ethylene | Mole Percent Cinnamoyl | Mole Percent Vinyl Hydrogen Succinate | Speed |
|---|---|---|---|---|---|
| G527–83 | 1.0 | 33 | 5 | 62 | 1 |
| G527–82 | 2.9 | 33 | 13 | 54 | 45 |
| G527–85 | 4.2 | 7 | 21 | 72 | 90 |
| G527–84 | 6.0 | 7 | 31 | 62 | 140 |

Other alkali-susceptible polymers can be used in the process of making printing plates as follows:

EXAMPLE 7

An alkali-soluble light sensitive polymer which is the condensation product of polyvinyl acetophenone with the p-carboxymethyl ether of benzaldehyde may be prepared as follows:

*p-Carboxymethyl ether of benzaldehyde (sodium salt)*

A mixture of 244 g. of p-hydroxybenzaldehyde and 189 g. of chloroacetic acid was heated until fused. While in the molten state, but using enough cooling to moderate the reaction, a concentrated solution of 170 g. of sodium hydroxide in water was cautiously added in small quantities. The reaction was exothermic and external cooling was used to keep the reaction under control, but not chilled enough to crystallize the mass. After the addition was complete, the mixture was still acid to phenolphthalein so a further portion of concentrated sodium hydroxide solution was cautiously added until the reaction was just alkaline to phenolphthalein. The hot solution was allowed to stand for 10–15 minutes at the end of which time it was still alkaline.

The solution was then poured into 3.5 liters of water containing 200 ml. of concentrated hydrochloric acid. The crystalline precipitate was filtered off by suction. This product was dissolved in a very slight excess of concentrated sodium hydroxide solution. The solution was slightly alkaline to phenolphthalein, the addition of 1–2 ml. of glacial acetic acid rendered the solution acidic to this indicator. The solution was now poured into about 10 liters of alcohol, the crystalline precipitate was filtered off and dried.

*Condensation product of polyvinylacetophenone with p-carboxymethyl ether of benzaldehyde*

To a stirred solution of 50 g. of polyvinylacetophenone (Kenyon et al., U. S. Patent 2,713,570, granted July 19, 1955) in a mixture of 500 ml. of dioxane and 500 ml. of 2-methoxyethanol was added 100 g. of the finely divided sodium salt of p-carboxymethyl ether of benzaldehyde. To the stirred slurry was added dropwise 10 ml. of a concentrated (40%) solution of trimethylbenzylammonium hydroxide solution. After 10 minutes, another 10 ml. was added dropwise and the procedure was repeated at 10-minute intervals until a total of 60 ml. had been added. The reaction product was now becoming increasingly hydrophilic and water had to be added slowly to the reaction mixture to maintain the polymer in solution. Two hundred and fifty ml. of distilled water was now added dropwise over a period of 25 minutes. Twenty ml. of 1 N sodium hydroxide was next added dropwise, and allowed to stir at room temperature for 2½ hours whereupon another 250 ml. of distilled water was added dropwise over a period of 25 minutes. After stirring at room temperature another 2.25 hours, a further 250 ml. of distilled water was added dropwise over a period of 15 minutes. The solution was allowed to stand at room temperature overnight. The yellow solution was filtered and poured in a thin stream into agitated dilute hydrochloric acid solution.

The fine yellow precipitate was washed thoroughly with distilled water by repeatedly stirring it in a slurry with distilled water, sucking the precipitate down on a suction funnel and repeating the operation until the wash water was acid-free. The polymer was dried in the dark at room temperature. The yield of product obtained was 78 g. and an analytical sample after having been extracted thoroughly with alcohol in a Soxhlet extractor showed a carboxyl content of 11.1%. The polymer was soluble in 2-methoxyethyl acetate and in a 10% aqueous solution of pyridine. The sodium salt of the polymer was readily soluble in 20% solution of alcohol in water. The triethanolamine salt had a similar solubility.

A 2% solution of the sodium salt of the above polymer in a 30% solution of ethanol-butanol (3:1) in water was coated on a sheet of grained zinc. The coating was exposed through a halftone negative to a sun lamp for 1 minute at a distance of 10 inches. The exposed coating was developed in a 30% solution of alcohol in water to give a highly swollen image. This image was treated with dilute acetic acid, washed and dried. The image was now much less swollen in water and was quite abrasion-resistant.

The polymer obtained is believed to contain recurring units having the structure

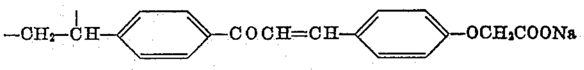

It will be noted that the above polymer was utilized photographically as the sodium salt. The polymer may, however, be neutralized to the acid form containing free carboxyl groups and in this form may be coated from dilute ammonia solution on a suitable metal plate and after drying down will be found to have reverted to the acid form through loss of ammonia in the drying operation. The plate thus coated can then be exposed under a suitable original and processed with dilute alkaline solution such as ammonium hydroxide, sodium carbonate or trisodium phosphate to yield resist images on the plate support.

EXAMPLE 8

Another light-sensitive alkali-susceptible polymer which is very useful in the process of our invention is the vinyl acetate-vinyl 3-azidophthalate copolymer described by Merrill et al. U. S. patent application Serial No. 525,368, filed July 29, 1955, which can be prepared as follows:

*3-azidophthalic acid anhydride*

One hundred fifty-one grams of 3-aminophthalic acid hydrochloride in 900 ml. of water and 150 ml. of concentrated hydrochloric acid was diazotized at 0–5° with a solution of 48 g. of sodium nitrite in 250 ml. of water. This cold solution was then treated with 48 g. of sodium azide in 250 ml. of water, in small portions. After stirring an hour, the mixture was allowed to stand overnight after which the azide was collected, washed with water, and dried by vacuum. The yield of 3-azidophthalic acid, M. P. 167–169° (dec.), was 115 g.

The above acid was added to 400 ml. of benzene and 200 ml. of acetic anhydride and heated at 65–75° for 2.5 hours. The resulting solution was filtered, reduced to near-dryness under vacuum, and the crystalline product was recrystallized from benzene-hexane which gave 87 g. of 3-azidophthalic anhydride, M. P. 123–125° (dec.).

The desired copolymer was prepared as follows:

To a solution of 10.0 g. of partially hydrolyzed polyvinyl acetate (47% hydrolyzed, molar basis) in 200 ml. of dry pyridine was added 14.2 g. of 3-azidophthalic anhydride. This mixture was stirred for 5 hours at 50–60° and allowed to stand overnight at room temperature. The resulting solution was diluted with 50 ml. of dioxane and poured slowly into 5 liters of 4% acetic acid. The fibrous polymer was washed in water and reprecipitated from dioxane into water. The dried polymer (16 g.) was soluble in dioxane and in aqueous alkali solutions. The resulting polymer contained about 53 mole percent of combined vinyl acetate units and the balance of the recurring polymeric units were essentially vinyl 3-azidophthalate units having the probable structure

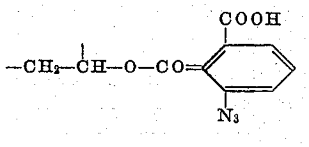

or

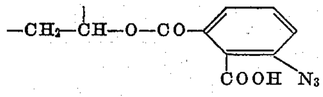

The polymer was found to have very high light sensitivity when tested by the above methods and may be coated from aqueous ammonia solution onto metal plates or other support such as lithographic plate supports, for example, grained zinc or aluminum, and after exposure to a carbon arc under a line or halftone subject and development with dilute ammonia solution, yields a resist image which can be readily inked and printed by lithographic methods. As mentioned herein, it is also advantageous to neutralize the resist image with acid prior to carrying out etching or inking operations conventional in the particular printing process.

EXAMPLE 9

Light-sensitive copolymers of maleic acid and maleic acid esters prepared as follows are also useful in the process of our invention:

*Vinyl toluene-maleic anhydride copolymer*

This polymer was prepared by heating equimolecular proportions of maleic anhydride and vinyl toluene (mixture of meta and para isomers) in dioxane in the presence of benzoyl peroxide catalyst followed by dilution of the polymerization mixture and precipitation into water. The polymer was soluble in dilute alkaline solutions. The polymer was light-sensitive and its photographic utility was shown by coating it from 2-butanone solution onto a hydrophilic surface followed by imagewise exposure and development of a resist image on the surface with 2-butanone or dilute alkali. Sensitizing agents such as mentioned above including 1,4-naphthoquinone, Michler's ketone, benzophenone, and 4,4'-diazidodiphenyl are useful in the coating for increasing the light-sensitivity.

EXAMPLE 10

*Reaction product of p-carboxymethoxy-p'-(β-hydroxyethoxy)-chalcone with a styrene-maleic anhydride copolymer*

*p-Carboxymethoxy-p-(β-hydroxyethoxy)chalcone*

To a solution of 27.8 g. of sodium hydroxide in 200 ml. water and 125 ml. of ethanol was added 99.7 g. of p-(β-hydroxyethoxy)acetophenone. The solution was cooled below room temperature and 112.2 g. of sodium p-formylphenoxyacetate was added while stirring. In a few minutes the solution was a solid mass of yellow crystals. This was dissolved in a minimum quantity of hot water and an equal volume of cold water. When this solution cooled to 40° C. it was acidified with concentrated hydrochloric acid and a yellow crystalline precipitate was formed. This was recrystallized from a hot solution of equal volumes of alcohol and water, the crystals filtered off and dried (M. P. 176–179° C.).

*Condensation with a styrene-maleic anhydride copolymer*

Fifty-seven grams of a dried (1 to 1) styrene-maleic anhydride copolymer was dissolved in 500 grams of dry pyridine. To the warm stirred solution was added a solution of 114.0 grams of p-carboxymethoxy-p'-(β-hydroxyethoxy)chalcone in 250 ml. of hot pyridine. After heating this solution on the steam bath for 3½ hours, it was poured into an agitated solution of 1.5 liters of acetic acid in 6 liters of distilled water. The fibrous precipitate was thoroughly washed with distilled water and the pressed out precipitate was redissolved in methyl ethyl ketone. This solution was again poured into a large volume of agitated distilled water. The fibrous precipitate was again washed well with distilled water and dried. The product had the following analysis: C, 68.6; H, 5.5; COOH, 15.8. The calculated values for the completely reacted product are: C, 68.5; H, 5.2; COOH, 16.4.

We have indicated in a general way in the above description how the alkali-soluble or susceptible polymers of the examples can be utilized in the preparation of printing plates. The polymers are dissolved in the appropriate solvent, such as aqueous alkaline solutions, to which the required amount of a solvent such as alcohol may be added or a purely organic solvent solution of the polymer may be prepared. A suitable concentration of the polymers in 0.5 percent ammonia solution is 1.5 percent (weight-volume). A sensitizing agent such as indicated above can then be added generally in an amount of the order of 10 percent of the weight of the polymer present. After sensitizing, the polymers are much more light-sensitive than well-known dichromated colloid systems and the polymers are highly stable under adverse conditions of temperature and humidity. A suitable printing support such as a hydrophilic lithographic paper base, copper or grained zinc or aluminum plate may then be coated with the light-sensitive polymer solutions. Thereafter the plate is exposed to an ultraviolet light source under a line or halftone subject (a so-called two-tone subject) until the layer of polymer has become insoluble in the region of exposure. By way of example, the polymers of Example 1 can be exposed under a halftone image for about 1½ to 2 minutes at three feet from a 35-ampere carbon arc. The exposure will of course vary with the light source. A dilute aqueous alkaline solution such as 0.5 percent ammonium hydroxide soltuion to which some alcohol may have been added as required is then applied to the plate for about 40 seconds or as long as one minute or more to remove the unexposed polymer leaving a resist image of insoluble polymer on the plate. Other alkaline aqueous solutions which may be used for the development of the resist image on the plates include: 0.25 percent aqueous triethanolamine, 0.1 percent aqueous trisodium phosphate, 0.5 percent aqueous sodium carbonate and 2.5 percent aqueous sodium acetate solutions. The resist image thus obtained on the plate may then be used as an etching resist in a well-known manner or for direct printing as in lithography. However, we have discovered that if the resist image comprising insolubilized polymer is in the form of the alkali metal or ammonium salt of the polymer, it is more hydrophilic than is desired for many printing purposes. For example, when the plates are used for lithographic printing, the resist image may not ink as well as desired, and it is necessary to neutralize the resist with dilute acid solution such as dilute acetic, hydrochloric or sulfuric acid solutions. The resulting neutralized resist is now hydrophobic and better resists conventional etching solutions and will ink better when used lithographically.

A parallel investigation of other light-sensitive alkali-soluble polymers similar in structure to those described above, except that the polymers were soluble in alkali by virtue of the presence of free sulfonic acid groups in the polymer chain, for example, a sulfobenzal-ar-vinylacetophenone polymer or a sulfocinnamoylpolystyrene polymer, has shown that resist images prepared therefrom and neutralized with acid are much too hydrophilic to be of any great use in making lithographic printing plates. Accordingly, the free carboxyl groups of the light-sensitive polymers of the invention confer a distinctive and valuable property on the polymers of our invention for printing purposes.

What we claim is:

1. A light-sensitive film-forming polymer containing from about 30 to 60 mol percent of recurring units having the general structure $$-CH_2-\overset{|}{C}H-O-CO-CH=CH-R$$

wherein R represents a univalent aromatic monocyclic radical of the benzene series whose free valence belongs to the aromatic nucleus, and from about 70 to 40 mol percent of recurring units selected from the class consisting of those having the structures $$-CH_2-\overset{|}{C}H-O-CO-(CH_2)_2-COOH$$

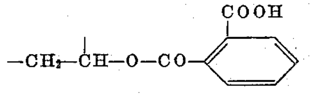

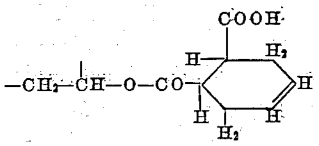

$$-CH_2-\overset{|}{C}H-O-CO-CH=CH-COOH$$

and

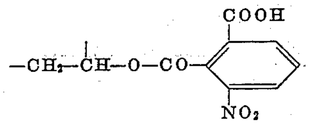

2. A light-sensitive film-forming polymer containing from about 30 to 60 mol percent of recurring units having the formula $$-CH_2-\overset{|}{C}H-O-CO-CH=CH-C_6H_5$$

and from about 70 to 40 mol percent of recurring units having the formula $$-CH_2-\overset{|}{C}H-O-CO-(CH_2)_2-COOH$$

3. A light-sensitive film-forming polymer containing from about 30 to 60 mol percent of recurring units having the formula $$-CH_2-\overset{|}{C}H-O-CO-CH=CH-C_6H_5$$

and from about 70 to 40 mol percent of recurring units having the formula

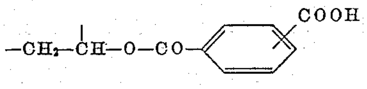

References Cited in the file of this patent

UNITED STATES PATENTS

| | | |
|---|---|---|
| 2,607,683 | Yackel et al. | Aug. 19, 1952 |
| 2,611,763 | Jones | Sept. 23, 1952 |
| 2,670,287 | Minsk et al. | Feb. 23, 1954 |
| 2,690,966 | Minsk et al. | Oct. 5, 1954 |
| 2,697,039 | Martinson | Dec. 14, 1954 |
| 2,725,372 | Minsk | Nov. 29, 1955 |
| 2,732,301 | Robertson et al. | Jan. 24, 1956 |